(12) United States Patent
Ravimohan et al.

(10) Patent No.: US 9,530,490 B2
(45) Date of Patent: Dec. 27, 2016

(54) COMPACTION PROCESS FOR A DATA STORAGE DEVICE

(71) Applicant: SANDISK TECHNOLOGIES INC., Plano, TX (US)

(72) Inventors: Narendhiran Chinnaanangur Ravimohan, Bangalore (IN); Muralitharan Jayaraman, Bangalore (IN)

(73) Assignee: SANDISK TECHNOLOGIES LLC, Plano, TX (US)

( * ) Notice: Subject to any disclaimer, the term of this patent is extended or adjusted under 35 U.S.C. 154(b) by 18 days.

(21) Appl. No.: 14/595,897

(22) Filed: Jan. 13, 2015

(65) Prior Publication Data
US 2016/0118125 A1    Apr. 28, 2016

(30) Foreign Application Priority Data
Oct. 27, 2014 (IN) ........................... 5316/CHE/2014

(51) Int. Cl.
G11C 11/00 (2006.01)
G11C 16/10 (2006.01)
G11C 11/56 (2006.01)
G11C 16/04 (2006.01)
G06F 13/16 (2006.01)

(52) U.S. Cl.
CPC ........... G11C 11/5628 (2013.01); G06F 13/16 (2013.01); G11C 16/0483 (2013.01); G11C 16/10 (2013.01)

(58) Field of Classification Search
CPC ......... G11C 16/10; G11C 16/14; G11C 16/16; G11C 2211/5641; G11C 16/349; G11C 11/5628; G11C 11/4193; G11C 11/4197
See application file for complete search history.

(56) References Cited

U.S. PATENT DOCUMENTS

| | | |
|---|---|---|
| 2011/0238886 A1 | 9/2011 | Post et al. |
| 2012/0033496 A1* | 2/2012 | Yano .................... G06F 12/0246 365/185.08 |
| 2012/0072639 A1 | 3/2012 | Goss et al. |
| 2013/0232296 A1* | 9/2013 | Yonezawa ........... G06F 12/0246 711/103 |
| 2013/0246716 A1* | 9/2013 | Kato ....................... G06F 3/064 711/148 |
| 2014/0181432 A1 | 6/2014 | Horn |

\* cited by examiner

Primary Examiner — Hien Nguyen
(74) Attorney, Agent, or Firm — Toler Law Group, PC

(57) ABSTRACT

A data storage device may include a memory die. The memory die may include a memory. A method may include selecting a source compaction block of the memory for a compaction process. The source compaction block stores data. The method may further include writing the data to a destination compaction block of the memory at a rate that is based on a number of multiple blocks of the memory associated with the compaction process.

13 Claims, 4 Drawing Sheets

COMPACTION PROCESS FOR A DATA STORAGE DEVICE

CROSS-REFERENCE TO RELATED APPLICATIONS

The present application claims priority from Indian Application No. 5316/CHE/2014, filed Oct. 27, 2014, the contents of which are incorporated by reference herein in their entirety.

FIELD OF THE DISCLOSURE

The present disclosure is generally related to data storage devices and more particularly to compaction processes for data storage devices.

BACKGROUND

Non-volatile data storage devices have enabled increased portability of data and software applications. For example, multi-level cell (MLC) storage elements of a memory device may each store a value indicating multiple bits of data, enhancing data storage density as compared to single-level cell (SLC) memory devices. Consequently, memory devices may enable users to store and retrieve a large amount of data.

To increase efficiency of data storage and retrieval, a memory device may perform a "garbage collection" (GC) process that consolidates data at a region of the memory device. For example, a GC process may include retrieving multiple portions (or "fragments") of a file from multiple blocks and writing the portions to a single region (e.g., a block) to facilitate more rapid retrieval of the file. As another example, data storage efficiency may be increased at a flash memory device by erasing a group of blocks that store invalid data (e.g., data that is to be deleted from the flash memory device). In this case, valid data (e.g., data that is not to be deleted) can be copied to another block, and the group of blocks may be erased to increase available storage space for write operations.

In some cases, a GC process may slow performance of a memory device. For example, if a block has a large amount of valid data to be relocated, performing the GC process may affect performance of other operations at the memory device, such as a write operation in response to a host request to write host data to the memory device. As an illustrative example, if the valid data includes 99 pages and the host data includes 1 page, operations to program the 1 page of host data may be "spread" across (e.g., interspersed with) operations to relocate the 99 pages of valid data. In this example, relocating the valid data from the block may decrease speed of the host write operation below a threshold rate (e.g., below a "minimum" rate specified by an industry standard with which the memory device is to comply, such as a Secure Digital (SD) specification, as an illustrative example).

SUMMARY

A data storage device includes a memory die that includes a memory. A compaction process may be initiated at the data storage device. The compaction process may copy valid data from source compaction blocks of the memory to a destination compaction block of the memory (e.g., to defragment a file that includes the valid data). For example, data may be copied from the source compaction blocks to the destination compaction block. After performing the compaction process, the source compaction block may be erased to free storage space of the memory.

The data may be written to the destination compaction block at a rate that is based on a first number of the source compaction blocks. To illustrate, a first source compaction block may include a large amount of valid data to be relocated to the destination compaction block and a second source compaction block may include a smaller amount of valid data to be relocated to the destination compaction block. In this case, performance slowdown associated with the first source compaction block may be reduced by increasing the rate at which data of the first source compaction block is copied to the destination compaction block and by decreasing the rate at which data of the second source compaction block is copied to the destination compaction block. For example, a rate of transfer of valid data for each block may be selected to "average out" performance slowdowns associated with the compaction process. In this example, copying a large amount of data from the first source compaction block is less likely to substantially slow a host write operation that is performed concurrently with the compaction process (because the rate at which the data is copied from the source compaction process has been reduced, which may free resources to perform the host write operation). In this case, the rate at which valid data is copied from the first source compaction block to the destination compaction block may be selected so that performing the host write operation satisfies a threshold rate, such as a rate associated with an industry standard.

DETAILED DESCRIPTION

Figure 1:
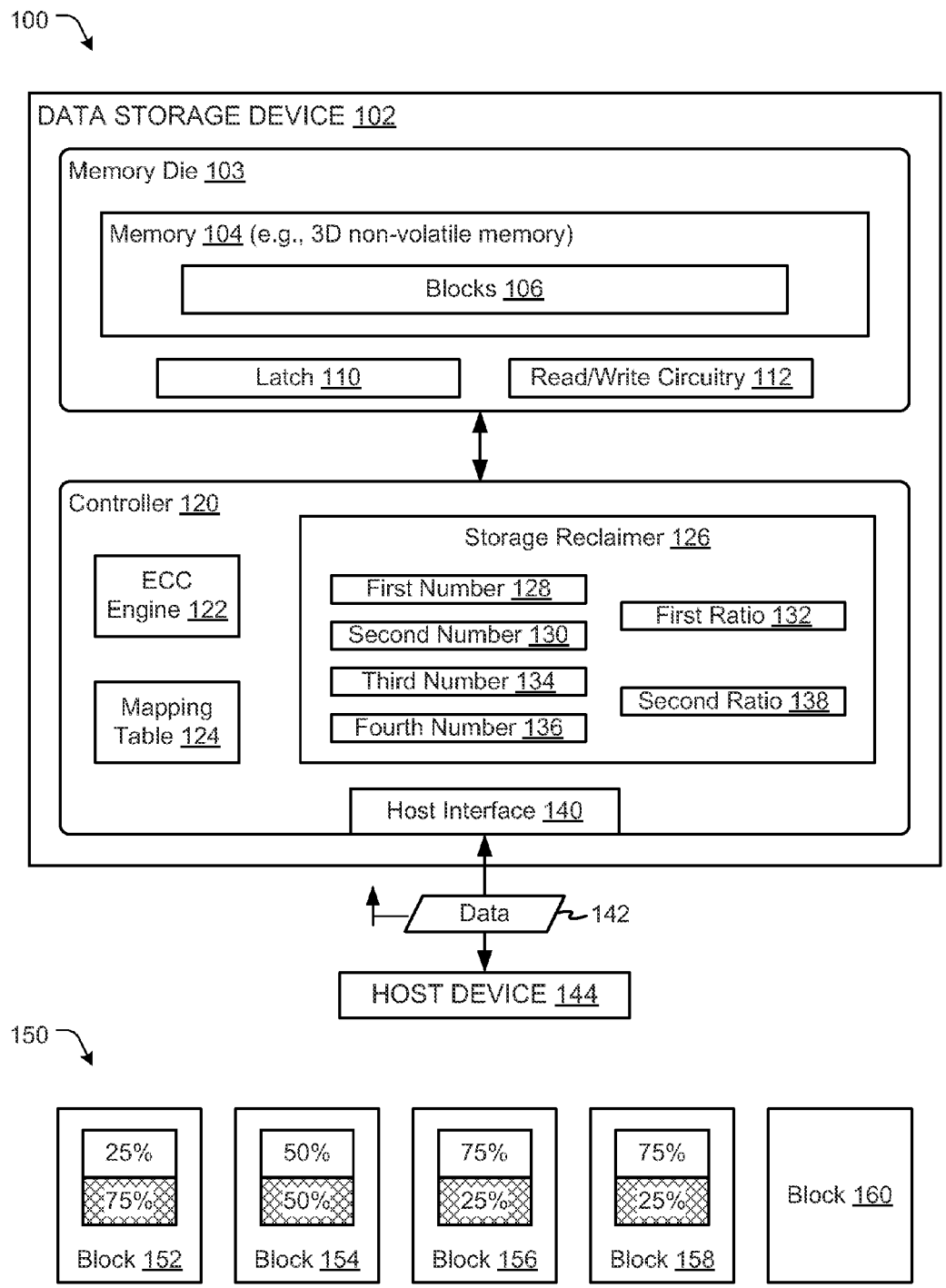
FIG. 1 is a block diagram of a particular illustrative embodiment of a system that includes a data storage device.

Referring to FIG. 1, an illustrative example of a system is depicted and generally designated 100. The system 100 includes a data storage device 102 and a host device 144. The data storage device 102 and the host device 144 may be operationally coupled via a connection, such as a bus or a wireless connection. The data storage device 102 may be embedded within the host device 144, such as in accordance with a Joint Electron Devices Engineering Council (JEDEC) Solid State Technology Association Universal Flash Storage (UFS) configuration. Alternatively, the data storage device 102 may be removable from the host device 144 (i.e., the data storage device 102 may be "removably" coupled to the host device 144). As an example, the data storage device 102 may be removably coupled to the host device 144 in accordance with a removable universal serial bus (USB) configuration.

The data storage device 102 may include a memory die 103 and a controller 120. The memory die 103 and the controller 120 may be coupled via one or more buses, one or more interfaces, and/or another structure. An interface may be wired (e.g., a bus structure) or wireless (e.g., a wireless communication interface). Although FIG. 1 depicts a single memory die (the memory die 103) for convenience, it should be appreciated that the data storage device 102 may include another number of memory dies corresponding to the memory die 103 (e.g., two memory dies, eight memory dies, or another number of memory dies).

The memory die 103 includes a memory 104, such as a non-volatile memory. For example, the memory 104 may include a flash memory, such as a NAND flash memory, or a resistive memory, such as a resistive random access memory (ReRAM), as illustrative examples. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include blocks 106 (e.g., erase groups of storage elements in a flash memory implementation or groups of resistive storage elements in a ReRAM implementation). Each of the blocks 106 may include a plurality of bit lines and word lines connecting multiple storage elements. Each storage element of the memory 104 may be programmable to a state (e.g., a threshold voltage in connection with a flash memory implementation or a resistive state in connection with a resistive memory implementation) that indicates one or more bit values. The memory die 103 may further include one or more latches (e.g., one or more data latches and/or one or more control latches). For example, the memory die 103 may include a latch 110. FIG. 1 also illustrates that the memory die 103 may further include read/write circuitry 112.

The controller 120 may include an error correcting code (ECC) engine 122, a storage reclaimer 124, and a host interface 140. The controller 120 may be configured to store a mapping table 124 (e.g., a logical-to-physical address mapping table, such as a logical group-based logical-to-physical address mapping table that assigns portions of the memory 104 to logical groups). The controller 120 may be coupled to the host device 144 via the host interface 140.

The controller 120 is configured to receive data and instructions from the host device 144 and to send data to the host device 144. For example, the controller 120 may receive data from the host device 144 via the host interface 140 and the controller 120 may send data to the host device 144 via the host interface 140.

The controller 120 is configured to send data and commands to the memory 104 and to receive data from the memory 104. For example, the controller 120 is configured to send data and a write command to cause the memory 104 to store the data to a specified address of the memory 104. The write command may specify a physical address of a portion (e.g., a word line) of the memory 104 that is to store the data. The controller 120 is configured to send a read command to the memory 104 to access data from a specified address of the memory 104. The read command may specify the physical address of a portion of the memory 104.

The ECC engine 122 may be configured to receive data from the host device 144 and to generate one or more ECC codewords based on the data. The ECC engine 122 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 122 may be configured to decode data accessed from the memory 104. For example, the ECC engine 122 may be configured to decode data accessed from the memory 104 to detect and correct one or more errors that may be present in the data, up to an error correcting capacity of the particular ECC scheme. The ECC engine 122 may include a Hamming decoder, an RS decoder, a BCH decoder, an LDPC decoder, a turbo decoder, a decoder configured to decode data according to one or more other ECC schemes, or a combination thereof.

The host device 144 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 144 may communicate via a host controller, which may enable the host device 144 to communicate with the data storage device 102. The host device 144 may operate in compliance with a JEDEC Solid State Technology Association industry specification, such as an embedded MultiMedia Card (eMMC) specification or a Universal Flash Storage (UFS) Host Controller Interface specification. The host device 144 may operate in compliance with one or more other specifications, such as a Secure Digital (SD) Host Controller specification as an illustrative example. Alternatively, the host device 144 may communicate with the data storage device 102 in accordance with another communication protocol.

During operation, the controller 120 may write, read, and erase data at the memory 104, such as in response to host requests received from the host device 144. To write, read, and erase data at the memory 104, the controller 120 may access and update the mapping table 124.

For example, the controller 120 may receive data 142 and a request for write access to the memory 104 from the host device 144. In response to receiving the data 142, the controller 120 may update an entry of the mapping table 124 to indicate that a physical address of the memory 104 is associated with a logical address. In some implementations, the controller 120 may adjust the entry to indicate that the entry is associated with valid data (e.g., that the data 142 is not to be deleted from the memory 104), such as by setting a valid bit associated with the entry to a first value. The controller 120 may cause the memory die 103 to store the data 142 (or a representation of the data 142) at the memory 104 (e.g., at one of the blocks 106).

As another example, in response to a read request from the host device 144 specifying the logical address, the controller 120 may access the mapping table 124 to map the logical address to the physical address. The controller 120 may use the physical address to access the data 142 from the memory 104 (e.g., by sending a command to the memory die 103 to read data from the physical address).

As an additional example, the controller 120 may access the mapping table 124 in response to a request from the host device 144 to erase the data 142 from the memory 104. In some implementations, data is not immediately deleted from the memory 104 in response to an erase request, such as in a flash memory implementation in which portions of a block are not separately erasable. In this case, the controller 120 may modify the valid bit to a second value to indicate that the data 142 is invalid (and that the data 142 may be erased from the memory 104 at a subsequent time).

The controller 120 may be configured to initiate a compaction process (also referred to herein as a "garbage collection" (GC) process or a storage reclamation process) using the storage reclaimer 126. For example, the compaction process may be initiated in response to a triggering event, such as when a threshold number of blocks of the memory 104 are in use (e.g., store valid data). As a non-limiting example, the storage reclaimer 126 may be configured to initiate the compaction process for each block of the memory 104 that stores valid data.

The controller 120 may be configured to perform the compaction process as a background process while the controller 120 handles other requests from the host device 144 (e.g., requests for read access and write access to the memory 104). For example, the data storage device 102 may initiate a host write operation in response to receiving a request for write access from the host device 144. In this example, the data storage device 102 may perform operations (e.g., writing of pages) of the compaction process "in between" operations of the host write operation (such as while the controller 120 is waiting to receive data from the host device 144).

After initiation of the compaction process, the storage reclaimer 126 may be configured to access the mapping table 124 to determine locations of valid and invalid data at the memory 104. The storage reclaimer 126 may be configured to copy (e.g., move, consolidate, or defragment) valid data from one or more of the blocks 106 (i.e., from one or more source compaction blocks associated with the compaction process). The valid data may be copied to one or more of the blocks 106 (i.e., to one or more destination compaction blocks associated with the compaction process). After moving the valid data from the one or more source compaction blocks, the storage reclaimer 126 may instruct the memory die 103 to erase the one or more source compaction blocks.

An example compaction process in accordance with the present disclosure determines a rate at which data is copied to the destination compaction block based on a number of source compaction blocks associated with the compaction process. To illustrate, FIG. 1 depicts blocks 150, which may correspond to (or be included in) the blocks 106 of the memory 104.

The blocks 150 include blocks 152, 154, 156, 158, and 160. In the example of FIG. 1, the blocks 152, 154, 156, and 158 correspond to source compaction blocks associated with a compaction process, and the block 160 corresponds to a destination compaction block associated with the compaction process. For example, the destination compaction block may correspond to an "overprovision" block of the memory 104 to which data is copied when other blocks of the memory 104 are in use. Although the example of FIG. 1 is described with reference to a single destination compaction block (the block 160), it should be appreciated that multiple destination compaction blocks may be used in connection with a compaction process (e.g., two destination compaction blocks or another number of destination compaction blocks).

In the example of FIG. 1, each of the blocks 152, 154, 156, and 158 store valid data to be copied to the block 160. For example, FIG. 1 depicts that 25% of data stored at the block 152 is valid, 50% of data stored at the block 154 is valid, 75% of data stored at the block 156 is valid, and 75% of data stored at the block 156 is valid. FIG. 1 also depicts percentages of invalid data at the blocks 152, 154, 156, and 158 (75% for the block 152, 50% for the block 154, 25% for the block 156, and 25% for the block 158). In a particular embodiment, the storage reclaimer 126 is configured to determine percentages (or amounts, such as numbers of pages) of valid data and/or percentages (or amounts, such as numbers of pages) of invalid data stored at blocks of the memory 104 in connection with a compaction process.

During the compaction process, the controller 120 may be configured to select a rate at which valid data is relocated in connection with the compaction process (e.g., from the block 152 to the block 160). The rate may correspond to a ratio of a number of write operations of the compaction process to a number of write operations initiated by the host device 144. To illustrate, for a rate of 0.5, one page of data to be compacted may be written to the memory 104 (e.g., copied from the block 152 to the block 160) for every two pages of host data written to the memory 104.

The controller 120 may be configured to select the rate based on a number of blocks of the memory 104 associated with the compaction process. To illustrate, in the example of FIG. 1, the number of blocks may be the first number 128 (e.g., equal to four corresponding to the blocks 152, 154, 156, and 158). In a particular embodiment, the rate is further based on a first ratio 132, which is a ratio between the first number 128 and a second number 130 of overprovision blocks of the memory 104 (e.g., blocks of the memory 104 that are reserved as destination compaction blocks). In the example of FIG. 1, the second number 130 is equal to one (corresponding to the block 160). In other cases, the second number 130 may be equal to two, three, four, or another number.

The rate may be further based on a second ratio 138 between a third number 134 of valid pages to be copied during the compaction process (i.e., valid pages stored in the blocks 152, 154, 156, and 158 in the example of FIG. 1) and a fourth number 136 of invalid pages (i.e., invalid pages stored in the blocks 152, 154, 156, and 158 in the example of FIG. 1). For example, the storage reclaimer 126 may be configured to determine the rate by multiplying the first ratio 132 and the second ratio 138.

To illustrate, if the first number 128 is equal to four and the second number 130 is equal to four, then the first ratio 132 is equal to one. If the third number 134 is equal to 50 and the fourth number 136 is equal to 100, then the second ratio 138 is equal to 0.5. In this example, multiplying the first ratio 132 and the second ratio 138 may produce a rate of 0.5 (and one compaction operation may be performed during the compaction process for every two host write operations). In another example, the second number 130 is equal to eight. In this case, multiplying the first ratio 132 and the second ratio 138 may produce a rate of 0.25 (and one compaction operation may be performed during the compaction process for every four host write operations). Alternatively, the rate may be another number (e.g., 0.3775, 0.65, or another number).

The storage reclaimer 126 is configured to select a source compaction block of the memory 104 (e.g., by selecting one of the blocks 152, 154, 156, and 158 in the example of FIG. 1). In a particular embodiment, the storage reclaimer 126 is configured to access the mapping table 124 to determine a block of the memory 104 storing the fewest valid pages or "fragments" (i.e., the block with the most space that can be freed using a compaction process). To illustrate, the block 152 stores fewer valid pages than the blocks 154, 156, and 158 (due to storing 25% valid data and 75% invalid data).

In this example, after selection of the block 152, valid data may be copied from the block 152 to the block 160. The valid data may be copied at the rate determined by the storage reclaimer 126. For example, copying data at the rate may enable a particular proportion of a number of commands issued by the controller 120 to the memory 104 that are associated with the compaction process relative to a number of commands issued by the controller 120 to the memory 104 that are associated with host requests from the host device 144. In this case, the storage reclaimer 126 may be configured to monitor requests from the host device 144 and to queue the requests with other requests that are associated with the compaction process (e.g., for a rate of 0.5, by inserting a compaction process request after every two host requests).

After copying of valid data from the block 152 to the block 160 is completed, the block 152 may be erased. For example, the controller 120 may erase the block 152 after completing copying of all valid data from the block 152, or the controller 120 may wait to erase the block 152 until the compaction process is completed (i.e., after valid data from each of the blocks 152, 154, 156, and 158 has been copied to the block 160).

After copying valid data from the block 152 to the block 160, the storage reclaimer 126 may be configured to select another block from which to copy valid data to the block 160. For example, the storage reclaimer 126 may select one of the remaining source compaction blocks storing data to be copied to the block 160 (i.e., one of the blocks 154, 156, and 158), such as by selecting one of the blocks 154, 156, and 158 storing the least amount of valid data. In the example of FIG. 1, the block 154 stores less valid data than the blocks 156, 158.

The storage reclaimer 126 may be configured to determine a second rate at which valid data is to be copied from the block 154 to the block 160. For example, the storage reclaimer 126 may be configured to re-determine the numbers 128, 134, and 136 (because the numbers 128, 134, and 136 have changed after copying all valid data from the block 152, such as due to one or more incoming host writes that may invalidate data in the remaining source compaction blocks). The storage reclaimer 126 may be configured to re-determine (e.g., recalculate) the first ratio 132 and the second ratio 138 to determine the second rate. The compaction process may continue until valid data of each of the blocks 152, 154, 156, and 158 has been copied to the block 160. Each of the of the blocks 152, 154, 156, and 158 may be erased, and the storage reclaimer 126 may update the mapping table to indicate that physical addresses associated with the blocks 152, 154, 156, and 158 are available for write operations.

Continuing with the above illustrative example, if the first number 128 is equal to four and the second number 130 is equal to four, then the first ratio 132 is equal to one. After copying valid data from the block 152 to the block 160, the first ratio 132 and the second ratio 138 may be recomputed (because the block 152 is no longer included in the compaction process, and thus total numbers of valid data and invalid data associated with the compaction process have changed). For example, prior to initiating the compaction process, the block 152 may store 10 valid pages (out of 50 total valid pages associated with the blocks 152, 154, 156, and 158) and may further store 30 invalid pages (out of 100 total invalid associated with the blocks 152, 154, 156, and 158). In this example, the third number 134 may be recomputed as 40, the fourth number 136 may be recomputed as 70, and the second ratio 138 may be recomputed to be 4/7 (or approximately 0.571). In this case, the second rate may be determined by multiplying the (redetermined) first ratio 132 and the (redetermined) second ratio 138 to produce 4/7. The block 154 may be compacted at a rate of approximately 0.571, such as by performing four compaction operations for the block 154 for every seven host write operations.

If the third number 134 is equal to 50 and the fourth number 136 is equal to 100, then the second ratio 138 is equal to 0.5. In this example, multiplying the first ratio 132 and the second ratio 138 may produce a rate of 0.5 (and one compaction operation may be performed during the compaction process for every two host write operations). In another example, the second number 130 is equal to eight. In this case, multiplying the first ratio 132 and the second ratio 138 may produce a rate of 1 (and one compaction operation may be performed during the compaction process for every host write operation). Alternatively, the rate may be another number (e.g., 0.3775, 0.65, or another number).

The examples of FIG. 1 illustrate techniques for selecting rates at which data is copied from multiple source compaction blocks (e.g., the blocks 152, 154, 156, and 158) to a destination compaction block (e.g., the block 160) during a compaction process at the data storage device 102. In FIG. 1, source compaction blocks may be defragmented on a multi-block basis (e.g., where a rate of compaction for a block is determined based on a total ratio of valid data to invalid data for all source compaction blocks) instead of on a per-block basis (e.g., where a rate of compaction for a block is determined based on the proportion of valid data to invalid data for that block). By selecting the rates using a multi-block technique, differences in performance slow-down associated with each of the source compaction blocks can be controlled (e.g., "evened out" or "balanced"). In some cases, balancing the performance differences in such a manner may enable the data storage device 102 to achieve a threshold host write performance criterion specified by one or more industry standards, such as a Secure Digital (SD) industry standard. For example, using a multi-block technique, defragmenting of a block storing a large amount of valid data can be expedited, which may enable host write operations to be performed more quickly during defragmenting of the block storing the large amount of valid data, which may increase the likelihood that the host write operations satisfy the threshold host write performance criterion.

Although certain performance balancing techniques have been described in connection with FIG. 1, it should be appreciated that alternative implementations are within the scope of the disclosure. For example, in at least one implementation, a compaction process includes multiple phases. Each phase may select one or more source compaction blocks based on a corresponding criterion (or set of criteria). The multiple phases may facilitate a performance tradeoff between a balanced compaction process (e.g., the compaction process described with reference to FIG. 1) and another compaction process, such as an unbalanced compaction process.

To illustrate, in a first phase of a compaction process, one or more blocks with older (e.g., less recently written) invalid data can be selected for a balanced technique (e.g., the compaction process described with reference to FIG. 1). The less recently written invalid data can be determined by analyzing timestamps associated with source compaction blocks (e.g., the blocks 152, 154, 156, and 158). For example, a block may be selected for the first phase if a timestamp associated with the block satisfies a threshold time duration (e.g., if at least a threshold time duration has elapsed since the invalid data was written or since other data was written at the block). Because such blocks store invalid data that has been written less recently at the memory 104 as compared to other blocks, data stored at these blocks is less likely to be invalidated by a request from the host device 144 for access to the memory 104 (i.e., such blocks store "older" and/or less frequency accessed data that is less likely to be overwritten by a host request) during the compaction process, thus reducing or avoiding unnecessary relocation of data that is subsequently invalidated by the host device 144. Thus, the blocks storing older invalid data can be selected for a first phase of the compaction process (to reduce or avoid relocation of data that is subsequently invalidated by the host device 144). These blocks may be compacted using the example compaction process of FIG. 1.

After completing the first phase, a determination may be made whether to apply a balanced technique or an unbalanced technique to the remaining source compaction blocks. For example, a decision may be made whether to defragment the remaining source compaction blocks on a per-block basis (e.g., where a rate of compaction for a block is determined based on the proportion of valid data to invalid data for that block) or on a multi-block basis (e.g., where a rate of compaction for a block is determined based on a total ratio of valid data to invalid data for all source compaction blocks). A determination to use compaction on a per-block basis may be made if a ratio of valid fragments at the source compaction blocks to invalid fragments at the source compaction blocks fails to satisfy a threshold (e.g., is less than 50%). A determination to use compaction on a multi-block basis may be made if a ratio of valid fragments at the source compaction blocks to invalid fragments at the source compaction blocks satisfies the threshold (e.g., is at least 50%). Accordingly, use of a multi-phase compaction process may achieve a performance tradeoff between multiple compaction techniques (e.g., to facilitate performance leveling (or "balancing") associated with a multi-block technique while also enabling computational simplicity of a per-block technique).

Thus, the controller 120 may be configured to utilize a multi-phase compaction process to compact data at the memory 104. For example, the controller 120 may be configured to select a source compaction block (e.g., the block 152) in response to determining that data stored by the source compaction block is less recently used than other data (e.g., as compared to data stored by the blocks 154, 156, and 158), such as by accessing one or more timestamps associated with the data. In this example, the data may be written to a destination compaction block (e.g., the block 160) during a first phase of the compaction process. The controller 120 may be further configured to initiate relocation of the other data to the destination compaction block during a second phase of the compaction process, such as on a "per-block" basis. The other data is more recently used than the data stored by the source compaction block. In this example, performance balancing may be achieved by utilizing a multi-block technique during the first phase (e.g., by targeting less recently used data that is less likely to be invalidated, which may reduce or avoid instances of relocated data being invalidated by commands from the host device 144) while also enabling simplified computations using a per-block basis (e.g., for more recently used data) during the second phase.

Figure 2:
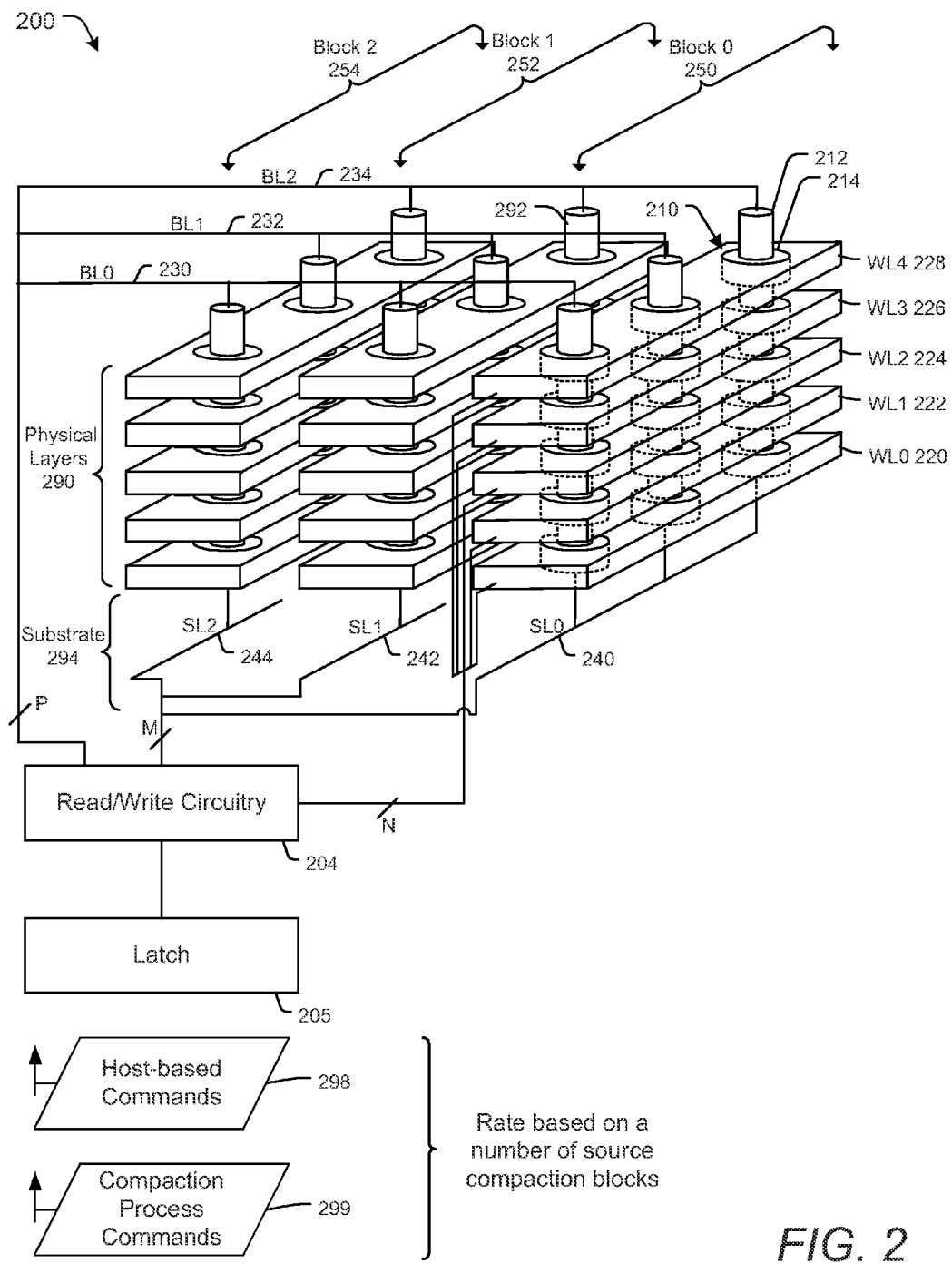
FIG. 2 is a diagram of an illustrative embodiment of a portion of a memory die that may be included in the data storage device of FIG. 1.

FIG. 2 illustrates a portion of a memory die 200 having a NAND flash configuration. The memory die 200 may be included in the data storage device 102 of FIG. 1. For example, the memory die 200 may correspond to the memory die 103 of FIG. 1, and the memory die 200 may be coupled to the controller 120 of FIG. 1.

The memory die 200 includes read/write circuitry 204 and a latch 205. The read/write circuitry 204 may correspond to the read/write circuitry 112 of FIG. 1, and the latch 205 may correspond to the latch 110 of FIG. 1.

The memory die 200 includes multiple physical layers, such as a group of physical layers 290. The multiple physical layers are monolithically formed above a substrate 294, such as a silicon substrate. Storage elements (e.g., memory cells), such as a representative memory cell 210, are arranged in arrays in the physical layers.

The representative memory cell 210 includes a charge trap structure 214 between a word line/control gate (WL4) 228 and a conductive channel 212. Charge may be injected into or drained from the charge trap structure 214 via biasing of the conductive channel 212 relative to the word line 228. For example, the charge trap structure 214 may include silicon nitride and may be separated from the word line 228 and the conductive channel 212 by a gate dielectric, such as silicon oxide. An amount of charge in the charge trap structure 214 affects an amount of current through the conductive channel 212 during a read operation of the memory cell 210 and indicates one or more bit values that are stored in the memory cell 210.

The memory die 200 includes multiple erase blocks, including a first block (block 0) 250, a second block (block 1) 252, and a third block (block 2) 254. Each block 250-254 includes a "vertical slice" of the physical layers 290 that includes a stack of word lines, illustrated as a first word line (WL0) 220, a second word line (WL1) 222, a third word line (WL2) 224, a fourth word line (WL3) 226, and a fifth word line (WL4) 228. Multiple conductive channels (having a substantially vertical orientation as depicted in FIG. 2) extend through the stack of word lines. Each conductive channel is coupled to a storage element in each word line 220-228, forming a NAND string of storage elements. FIG. 2 illustrates three blocks 250-254, five word lines 220-228 in each block, and three conductive channels in each block for clarity of illustration. However, the memory die 200 may have more than three blocks, more than five word lines per block, and more than three conductive channels per block.

The read/write circuitry 204 is coupled to the conductive channels via multiple conductive lines, illustrated as a first bit line (BL0) 230, a second bit line (BL1) 232, and a third bit line (BL2) 234 at a "top" end of the conducive channels (e.g., at a location farther from the substrate 294) and a first source line (SL0) 240, a second source line (SL1) 242, and a third source line (SL2) 244 at a "bottom" end of the conductive channels (e.g., at a location nearer to or within the substrate 294). The read/write circuitry 204 is illustrated as coupled to the bit lines 230-234 via "P" control lines, coupled to the source lines 240-244 via "M" control lines, and coupled to the word lines 220-228 via "N" control lines. Each of P, M, and N may have a positive integer value based on the specific configuration of the memory die 200. In the illustrative example of FIG. 2, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 292 and a particular source line may be coupled to the top of the conductive channel 212. The bottom of the conductive channel 292 may be coupled (e.g., electrically coupled) to the bottom of the conductive channel 212. Accordingly, the conductive channel 292 and the conductive channel 212 may be coupled in series and may be coupled to the particular bit line and the particular source line.

During a read operation, the controller 120 of FIG. 1 may receive a request from a host device, such as the host device 144 of FIG. 1. The controller 120 may send a host-based command (e.g., a read command initiated by the host device 144), such as by issuing one or more host-based commands 298. In response to one of the host-based commands 298, the read/write circuitry 204 may read bits from particular storage elements of the memory die 200 by applying appropriate signals to the control lines to cause storage elements of a selected word line to be sensed. Accordingly, the memory die 200 may be configured to read from and write data to one or more storage elements.

During a write operation, the controller 120 of FIG. 1 may receive a request from a host device, such as the host device 144 of FIG. 1. The request may include data (e.g., the data 142 of FIG. 1) to be written at storage elements of the memory die 200. In response to the request, the controller 120 may issue one or more of the host-based commands to the memory die 200. The read/write circuitry 204 may be configured to program the data to storage elements of the memory die 200. For example, the read/write circuitry 204 may be configured to apply selection signals to control lines coupled to the word lines 220-228, the bit lines 230-234, and the source lines 240-242 to cause a programming voltage (e.g., a voltage pulse or series of voltage pulses) to be applied across one or more selected storage elements of the selected word line (e.g., the fourth word line 228, as an illustrative example).

The compaction process described with reference to FIG. 1 may be performed while the memory die 200 receives and responds to the host-based commands 298 from the controller 120 of FIG. 1. For example, the controller 120 may issue compaction process commands 299 using a particular rate. The rate may be selected by the controller 120 based on a number of source compaction blocks associated with the compaction process (e.g., based on the first number 128 of FIG. 1), such as by multiplying the first ratio 132 and the second ratio 138. The source compaction blocks may include the blocks 250, 252, and 254, as an illustrative example.

Figure 3:
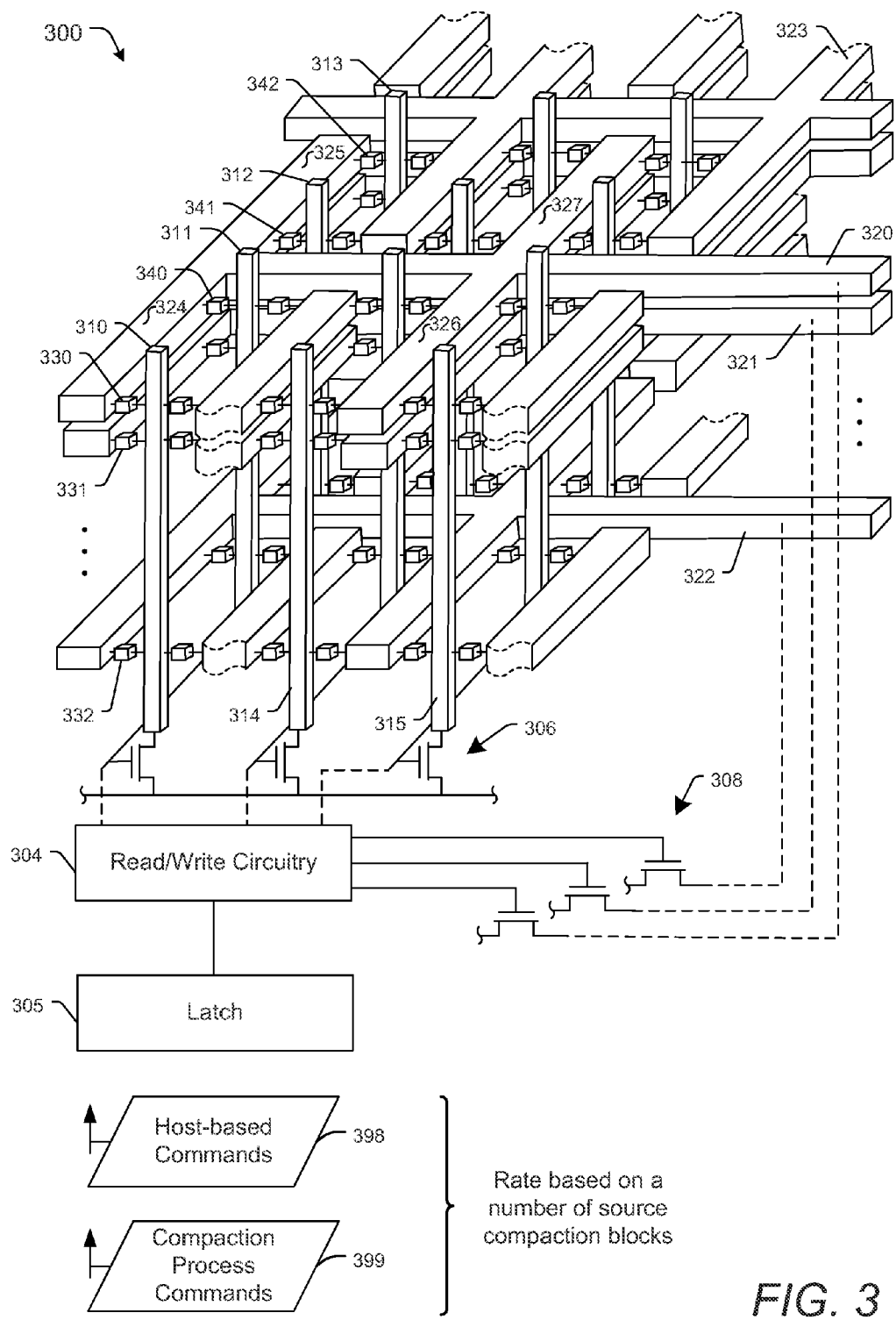
FIG. 3 is a diagram of another illustrative embodiment of a portion of a memory die that may be included in the data storage device of FIG. 1.

FIG. 3 illustrates a portion of a memory die 300 having a ReRAM configuration that is different than the illustrative NAND flash configuration of FIG. 2. The memory die 300 may be included in the data storage device 102 of FIG. 1. For example, the memory die 300 may correspond to the memory die 103 of FIG. 1. The memory die 300 may be coupled to the controller 120 of FIG. 1 (or to the host device 144 of FIG. 1).

The memory die 300 includes read/write circuitry 304 and a latch 305. The read/write circuitry 304 may correspond to the read/write circuitry 112 of FIG. 1, and the latch 305 may correspond to the latch 110 of FIG. 1.

In the example of FIG. 3, the memory die 300 includes a vertical bit line (VBL) ReRAM with a plurality of conductive lines in physical layers over a substrate (e.g., substantially parallel to a surface of the substrate), such as representative word lines 320, 321, 322, and 323 (only a portion of which is shown in FIG. 3) and a plurality of vertical conductive lines through the physical layers, such as representative bit lines 310, 311, 312, and 313. The word line 322 may include or correspond to a first group of physical layers, and the word lines 320, 321 may include or correspond to a second group of physical layers.

The memory die 300 also includes a plurality of resistance-based storage elements (e.g., memory cells), such as representative storage elements 330, 331, 332, 340, 341, and 342. Each of the storage elements 330, 331, 332, 340, 341, and 342 is coupled to (or is associated with) a bit line and a word line in arrays of memory cells in multiple physical layers over the substrate (e.g., a silicon substrate).

In the example of FIG. 3, each word line includes a plurality of fingers. To illustrate, the word line 320 includes fingers 324, 325, 326, and 327. Each finger may be coupled to more than one bit line. For example, the finger 324 of the word line 320 is coupled to the bit line 310 via the storage element 330 at a first end of the finger 324, and the finger 324 is further coupled to the bit line 311 via the storage element 340 at a second end of the finger 324.

In the example of FIG. 3, each bit line may be coupled to more than one word line. To illustrate, the bit line 310 is coupled to the word line 320 via the storage element 330, and the bit line 310 is further coupled to the word line 322 via the storage element 332.

During a write operation, the controller 120 of FIG. 1 may receive data (e.g., the data 142 of FIG. 1) from a host device, such as the host device 144 of FIG. 1. The controller 120 may send a write command to the memory die 300 and may store the data into the latch 305. The read/write circuitry 304 may be configured to access the data in the latch 305 and to program the data to storage elements corresponding to the destination of the data. For example, the read/write circuitry 304 may apply selection signals to selection control lines coupled to the word line drivers 308 and the bit line drivers 306 to cause a write voltage to be applied across a selected storage element. As an illustrative example, to select the storage element 330, the read/write circuitry 304 may activate the word line drivers 308 and the bit line drivers 306 to drive a programming current (also referred to as a write current) through the storage element 330. To illustrate, a first write current may be used to write a first logical value (e.g., a value corresponding to a high-resistance state) to the storage element 330, and a second write current may be used to write a second logical value (e.g., a value corresponding to a low-resistance state) to the storage element 330. The programming current may be applied by generating a programming voltage across the storage element 330 by applying a first voltage to the bit line 310 and to word lines other than the word line 320 and by applying a second voltage to the word line 320. In a particular embodiment, the first voltage is applied to other bit lines (e.g., the bit lines 314, 315) to reduce leakage current in the memory die 300.

During a read operation, the controller 120 may receive a request from a host device, such as the host device 144 of FIG. 1. The controller 120 may issue a command to the memory die 300 specifying one or more physical addresses of the memory die 300. The memory die 300 may cause the read/write circuitry 304 to read bits from particular storage elements of the memory die 300, such as by applying selection signals to selection control lines coupled to the word line drivers 308 and the bit line drivers 306 to cause a read voltage to be applied across a selected storage element. For example, to select the storage element 330, the read/write circuitry 304 may activate the word line drivers 308 and the bit line drivers 306 to apply a first voltage (e.g., 0.7 volts (V)) to the bit line 310 and to word lines other than the word line 320. A lower voltage (e.g., 0 V) may be applied to the word line 320. Thus, a read voltage is applied across the storage element 330, and a read current corresponding to the read voltage may be detected at a sense amplifier of the read/write circuitry 304. The read current corresponds (via Ohm's law) to a resistance state of the storage element 330, which corresponds to a logic value stored at the storage element 330. The logic value read from the storage element 330 and other elements read during the read operation may be provided to the controller 120 of FIG. 1 (e.g., via the latch 305).

The compaction process described with reference to FIG. 1 may be performed as a background process while the memory die 300 receives and responds to host-based commands 398 from the controller 120 of FIG. 1. For example, the controller 120 may issue compaction process commands 399 such that a particular rate of the compaction process is achieved. The rate may be selected by the controller 120 based on a number of source compaction blocks associated with the compaction process (e.g., based on the first number 128 of FIG. 1), such as by multiplying the first ratio 132 and the second ratio 138.

Thus, FIGS. 2 and 3 illustrate that the examples described herein are applicable to multiple memory configurations (e.g., the NAND flash configuration of FIG. 2 and the ReRAM configuration of FIG. 3, as illustrative examples). In a ReRAM configuration, such as in the example of FIG. 3, a "block" may refer to a storage region of a ReRAM (e.g., a word line of storage elements, a bit line of storage elements, or a physical layer of storage elements). In other cases, a "block" may refer to a logical group of data, such as a file having multiple pages that are associated with a logical group. The mapping table 124 of FIG. 1 may identify that the multiple pages are associated with the logical group.

Figure 4:
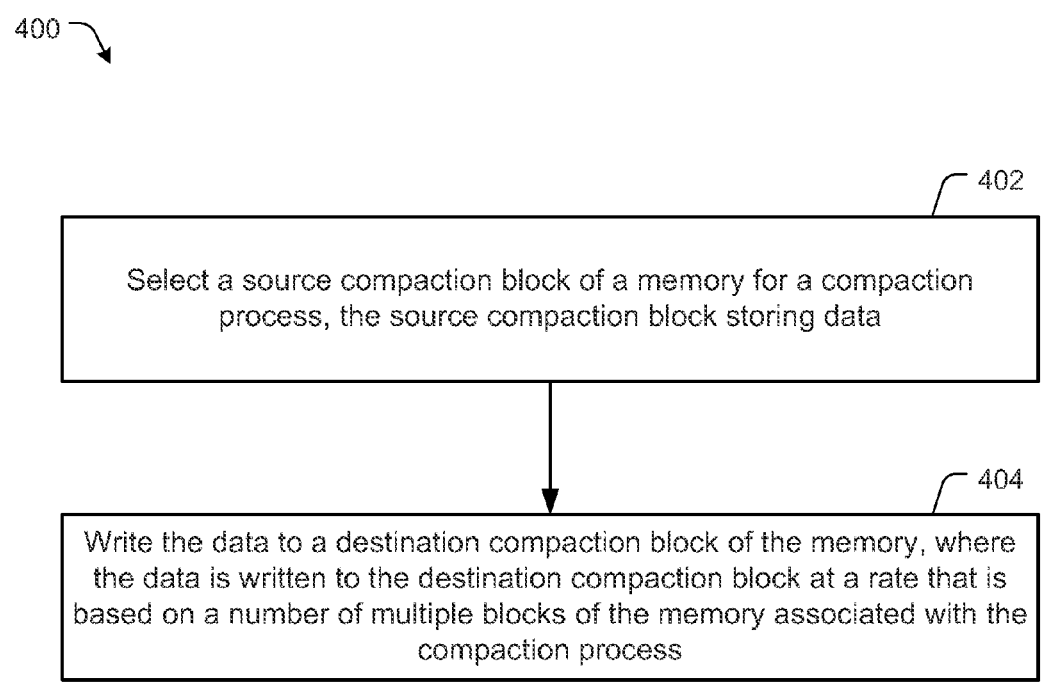
FIG. 4 is a flow diagram of an illustrative embodiment of a method of operation of the data storage device of FIG. 1.

Referring to FIG. 4, an illustrative example of a method is depicted and generally designated 400. The method 400 may be performed at a data storage device (e.g., the data storage device 102) that includes a memory die (e.g., any of the memory dies 103, 200, and 300). The memory die may include a memory (e.g., the memory 104).

The method 400 includes selecting a source compaction block of the memory for a compaction process, at 402. The source compaction block stores data. In an illustrative example, the source compaction block corresponds to the block 152 of FIG. 1, and the data corresponds to valid data stored by the block 152. In other examples, the source compaction block may correspond to another block (e.g., one of the blocks 154, 156, 158, 250, 252, and 254, or a region of the memory die 300, such as a word line, a bit line, or a physical layer of the memory die 300, or a logical group of data indicated by the mapping table 124).

The method 400 further includes writing the data to a destination compaction block of the memory, at 404. As an illustrative example, the destination compaction block may correspond to the block 160 of FIG. 1, and writing the data may include copying the data from the block 152 to the block 160. The data may be written (e.g., using the read/write circuitry 112, 204, or 304) to the destination compaction block at a rate that is based on a number of multiple blocks of the memory associated with the compaction process. For example, the first number 128 may indicate a number of source compaction blocks (e.g., four, in the case of the blocks 152, 154, 156, and 158, or three, in the case of the blocks 250, 252, and 254, or another number) that are associated with the compaction process.

The data storage device may further include a controller coupled to the memory, and the source compaction block may be selected by the controller. For example, the controller may correspond to the controller 120 of FIG. 1. In a particular embodiment, the storage reclaimer 126 performs or initiates operations of the method 400.

The method 400 may optionally include performing a host write operation to the memory while the compaction process is performed as a background process. For example, the host write operation may be initiated by the host device 144, and operations of the compaction process can be performed "in between" operations of the host write operation (such as while the controller 120 is waiting to receive data from the host device 144).

In a particular embodiment, the rate is further based on a first ratio between the number of blocks and a second number of overprovision blocks of the memory. For example, the second number may correspond to the second number 130, and the first ratio may correspond to the first ratio 132. The rate may be further based on a second ratio between a third number of valid pages stored in the multiple blocks and a fourth number of invalid pages stored in the multiple blocks. For example, the third number may correspond to the third number 134, the fourth number may correspond to the fourth number 136, and the second ratio may correspond to the second ratio 138.

The method 400 may optionally include determining the rate prior to initiating the compaction process (or prior to each phase of the compaction process). For example, the rate may be determined (e.g., by the storage reclaimer 126) by multiplying the first ratio 132 and the second ratio 138 to determine the rate.

The method 400 may optionally include re-determining the first ratio and the second ratio after writing the data from the source compaction block to the destination compaction block and selecting a second source compaction block (e.g., the block 154) of the memory for the compaction process, the source compaction block storing second data (e.g., valid data to be copied to the block 160). In this example, the method 400 may further include writing the second data at the destination compaction block at a second rate that is based on the re-determined first ratio and the re-determined second ratio (e.g., the second rate determined by multiplying the re-determined first ratio and the re-determined second ratio).

The method 400 may be performed in connection with a multi-phase compaction process. For example, the source compaction block may be selected in response to determining that the data is less recently used than other data stored by the multiple blocks, such as by accessing one or more timestamps associated with the data. The data may be written during a first phase of the compaction process. In this example, the method 400 may further include relocating the other data to the destination compaction block during a second phase of the compaction process (e.g., on a "per-block" basis instead of using a "multi-block" basis).

In a particular embodiment, the memory has a three-dimensional (3D) memory configuration that is monolithically formed in one or more physical levels of arrays of memory cells having an active area above a silicon substrate. The memory die may further include circuitry associated with operation of the memory cells. As a non-limiting, illustrative example, the circuitry may correspond to the read/write circuitry 112, the read/write circuitry 204, or the read/write circuitry 304.

In connection with the described embodiments, a data storage device (e.g., the data storage device 102) includes a memory (e.g., the memory 104) and a controller (e.g., the controller 120) coupled to the memory. The memory includes at least a first block (e.g., the block 152, or another block, such as the block described with reference to FIG. 2 or a block described with reference to FIG. 3) and a second block (e.g., the block 160, or another block, such as the block described with reference to FIG. 2 or a block described with reference to FIG. 3). The controller is configured to select the first block for a storage reclamation process (e.g., the compaction process described with reference to FIG. 1) that copies data from the first block to the second block. The controller is further configured to write the data to the second block at a rate that is based on a first number of multiple blocks of the memory associated with the storage reclamation process. The first number may correspond to the first number 128 of FIG. 1.

Although the controller 120 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein (e.g., the storage reclaimer 126) may include one or more physical components, such as hardware controllers, state machines, logic circuits, one or more other structures, or a combination thereof, to enable the data storage device 102 to perform one or more operations described herein. As an illustrative example, the storage reclaimer 126 may include one or more physical components, such as hardware controllers, state machines, logic circuits, one or more other structures, or a combination thereof, to enable the storage reclaimer 126 to access the mapping table 124 and to calculate the first number 128, the second number 130, the third number 134, the fourth number 136, the first ratio 132, and the second ratio 138. The storage reclaimer 126 may include a hardware device configured to multiply the first ratio 132 and the second ratio 138 to determine a rate associated with a compaction process. For example, the storage reclaimer 126 may include a multiplier device, an arithmetic and logic unit (ALU), or another device configured to determine the rate.

Alternatively or in addition, one or more aspects of the data storage device 102 may be implemented using a microprocessor or microcontroller that executes instructions. For example, one or more operations described with reference to the storage reclaimer 126 may be implemented using a processor that executes instructions to perform operations described herein, such as one or more operations of the method 400 of FIG. 4. As an illustrative example, the storage reclaimer 126 may include a processor that is configured to execute instructions to access the mapping table 124 and to calculate the first number 128, the second number 130, the third number 134, the fourth number 136, the first ratio 132, and the second ratio 138. The processor may execute an instruction to multiply the first ratio 132 and the second ratio 138 to determine a rate associated with a compaction process. For example, the processor may execute a multiply instruction to determine the rate.

It is noted that instructions that are executed by a processor may be stored at and retrieved from the memory 104. Alternatively or in addition, instructions that are executed by the processor may be retrieved from a separate memory location that is not part of the memory 104, such as at a read-only memory (ROM). The controller 120 may include such a ROM or other memory.

It is also noted that certain characteristics of the data storage device 102 may be modified, such as using a firmware update or other update. To illustrate, as the data storage device 102 is operated, physical characteristics of the data storage device 102 may change (e.g., storage elements of the memory 104 may undergo physical degradation or wear). Change in physical characteristics may result in different operation of the data storage device 102, such as increased leakage current. Techniques described herein can be updated (e.g., via a firmware update), such as by changing the triggering event for initiation of a compaction process. For example, as the data storage device 102 ages, the threshold number of used blocks of the memory 104 can be reduced so that the compaction process is performed more often so that data is "refreshed" more often.

The data storage device 102 may be attached to or embedded within one or more host devices, such as within a housing of a host communication device (e.g., the host device 144). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 144.

To further illustrate, the data storage device 102 may be configured to be coupled to the host device 144 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a memory that includes at least a first block and a second block; and
a controller coupled to the memory, wherein the controller is configured to select the first block for a storage reclamation process that copies data from the first block to the second block, wherein the controller is further configured to write the data to the second block at a rate that is based on a number of multiple blocks of the memory associated with the storage reclamation process, and wherein the controller is further configured to set the rate to enable processing of a request for access to the memory based on at least a threshold rate.

2. The data storage device of claim 1, wherein the request indicates a host write operation, and wherein the controller is further configured to initiate the host write operation while the storage reclamation process is performed as a background process during the host write operation.

3. The data storage device of claim 1, wherein the number of blocks corresponds to a first number of source compaction blocks, and wherein the rate is further based on a first ratio between the first number of source compaction blocks and a second number of overprovision blocks of the memory.

4. The data storage device of claim 3, wherein the rate is further based on a second ratio between a third number of valid pages stored in the multiple blocks and a fourth number of invalid pages stored in the multiple blocks.

5. The data storage device of claim 4, wherein the controller is further configured to determine the rate prior to initiating the storage reclamation process.

6. The data storage device of claim 5, wherein the controller is further configured to determine the rate by multiplying the first ratio and the second ratio.

7. The data storage device of claim 1, wherein the memory has a three-dimensional (3D) memory configuration.

8. The data storage device of claim 7, wherein the 3D memory configuration is monolithically formed in one or more physical levels of arrays of memory cells having an active area above a silicon substrate.

9. The data storage device of claim 8, further comprising circuitry associated with operation of the memory cells.

10. The data storage device of claim 1, wherein the controller is further configured to select the source compaction block in response to determining that the data is less recently used than other data stored by the multiple blocks, and wherein the data is written during a first phase of the compaction process.

11. The data storage device of claim 10, wherein the controller is further configured to initiate relocation of the other data to the destination compaction block during a second phase of the compaction process.

12. An apparatus comprising:
a non-volatile memory that includes at least a first storage region, a second storage region, and a third storage region; and
a controller coupled to the non-volatile memory, wherein the controller is configured to initiate a compaction process to copy first valid data from the first storage region to the third storage region at a first transfer rate and to copy second valid data from the second storage region to the third storage region at a second transfer rate, and wherein the controller is further configured to set the first transfer rate and the second transfer rate to reduce a performance difference between a first operation of a write process to write data to the non-volatile memory and a second operation of the write process to write data to the non-volatile memory.

13. The apparatus of claim 12, wherein the controller is further configured to initiate the first operation during copying of the first data and to initiate the second operation during copying of the second data.

* * * * *